(12) United States Patent
Kurokawa et al.

(10) Patent No.: US 11,948,986 B2
(45) Date of Patent: Apr. 2, 2024

(54) SEMICONDUCTOR DEVICE

(71) Applicant: Murata Manufacturing Co., Ltd., Kyoto-fu (JP)

(72) Inventors: Atsushi Kurokawa, Nagaokakyo (JP); Masahiro Shibata, Nagaokakyo (JP); Hiroaki Tokuya, Nagaokakyo (JP); Mari Saji, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 45 days.

(21) Appl. No.: 17/348,811

(22) Filed: Jun. 16, 2021

(65) Prior Publication Data

US 2021/0391429 A1 Dec. 16, 2021

(30) Foreign Application Priority Data

Jun. 16, 2020 (JP) .................. 2020-103786

(51) Int. Cl.
*H01L 29/417* (2006.01)
*H01L 29/08* (2006.01)
*H01L 29/73* (2006.01)

(52) U.S. Cl.
CPC .... *H01L 29/41708* (2013.01); *H01L 29/0817* (2013.01); *H01L 29/73* (2013.01)

(58) Field of Classification Search
CPC ............. H10K 85/6574; H10K 85/631; H10K 85/622; H10K 85/6572; H10K 2101/10; H10K 2101/40; H10K 50/18; H10K 50/11; H01L 29/41708; H01L 29/0817; H01L 29/73; H01L 24/13; H01L 24/16; H01L 24/81; H01L 2224/02166; H01L 2224/0401; H01L 2224/05644; H01L 2224/13021; H01L 2224/13082; H01L 2224/13101; H01L 2224/13147; H01L 2224/16225; H01L 2224/81815; H01L 2924/10329; H01L 2924/351; H01L 2924/3512; H01L 29/7371; H01L 29/0696; H01L 23/49568; H01L 27/082; H01L 29/737

See application file for complete search history.

(56) References Cited

U.S. PATENT DOCUMENTS

2023/0079200 A1* 3/2023 Oh .......................... H01L 33/58
257/98

FOREIGN PATENT DOCUMENTS

JP 2000-349189 A 12/2000
JP 2009-194144 A 8/2009
(Continued)

*Primary Examiner* — Mohammad A Rahman
(74) *Attorney, Agent, or Firm* — Studebaker & Brackett PC

(57) ABSTRACT

A mesa portion is formed on a substrate. An insulating film including an organic layer is disposed on the mesa portion. A conductor film is disposed on the insulating film. A cavity provided in the organic layer has side surfaces extending in a first direction. A shorter distance out of distances in a second direction perpendicular to the first direction from the mesa portion to the side surfaces of the cavity in plan view is defined as a first distance. A shorter distance out of distances in the first direction from the mesa portion to side surfaces of the cavity in plan view is defined as a second distance. A height of a first step of the mesa portion is defined as a first height. At least one of the first distance and the second distance is greater than or equal to the first height.

20 Claims, 8 Drawing Sheets

(56) References Cited

FOREIGN PATENT DOCUMENTS

| JP | 2019-114750 A | 7/2019 |
|---|---|---|
| JP | 2019-149485 A | 9/2019 |
| WO | 2015104967 A1 | 7/2015 |

* cited by examiner

SEMICONDUCTOR DEVICE

CROSS-REFERENCE TO RELATED APPLICATION

This application claims benefit of priority to Japanese Patent Application No. 2020-103786, filed Jun. 16, 2020, the entire content of which is incorporated herein by reference.

BACKGROUND

Technical Field

The present disclosure relates to a semiconductor device.

Background Art

There is a need for improvement of output of power amplifiers mainly used for radio communication devices. For amplifying elements included in the power amplifiers, a transistor such as, for example, a heterojunction bipolar transistor (HBTs) is used. In order to improve the output of the power amplifiers, improvement of heat dissipation from the transistor is required.

In some cases, a semiconductor chip in which a transistor is formed is mounted face-down on a module board through a bump. The semiconductor chip is heated in a solder reflow process in mounting on the module board. In a process of reducing the temperature after the heating of the semiconductor chip, thermal stress is generated due to the difference in thermal expansion coefficient between a plurality of elements of the semiconductor chip. International Publication No. 2015/104967 discloses a semiconductor device that can reduce thermal stress applied to a transistor. In the semiconductor device disclosed in International Publication No. 2015/104967, the stress applied to the transistor is reduced by shifting a bump in the in-plane direction relative to an emitter region of the transistor.

SUMMARY

Heat generated in the transistor is conducted to the module board through the bump. When the bump is shifted in the in-plane direction relative to the emitter region of the transistor, thermal resistance from the transistor to the bump increases. Thus, reliably obtaining sufficient heat dissipation is difficult. Accordingly, it cannot be said that the configuration in which the bump is shifted in the in-plane direction relative to the emitter region is suitable for the improvement of the output of the power amplifier.

Accordingly, the present disclosure provides a semiconductor device that can suppress degradation of reliability caused by stress and that can suppress degradation of heat dissipation.

According to an aspect of preferred embodiments of the present disclosure, a semiconductor device is provided. The semiconductor device includes a substrate, at least one mesa portion, an insulating film, and a conductor film. The at least one mesa portion is formed on the substrate, includes at least part of a semiconductor layer of a transistor therein, and has at least one level difference. The insulating film is disposed on the at least one mesa portion, includes an organic layer formed of an organic insulating material, and has a cavity. The conductor film is disposed on the insulating film and is electrically connected to the transistor through the cavity provided in the insulating film. The cavity provided in the organic layer contains the at least one mesa portion in plan view and has side surfaces extending in a first direction. When a shorter distance out of distances in a second direction perpendicular to the first direction from the at least one mesa portion to the side surfaces on both sides of the cavity of the organic layer in the plan view is defined as a first distance, a shorter distance out of distances in the first direction from the at least one mesa portion to side surfaces on both sides of the cavity of the organic layer in the plan view is defined as a second distance, and a height of a first step of the at least one mesa portion is defined as a first height, at least one of the first distance and the second distance is greater than or equal to the first height.

When at least one of the first distance and the second distance is greater than or equal to the first height, influence affecting the at least one mesa portion caused by stress applied to a region near the side surfaces of the cavity can be reduced. This can suppress degradation of the reliability due to the stress. Since the cavity provided in the organic layer contains the at least one mesa portion in plan view, no organic layer is disposed in a heat conduction path directed from the at least one mesa portion to an upper region relative to the substrate. Since the organic layer does not obstruct heat conduction, degradation of heat dissipation can be suppressed.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor device according to a first embodiment is described with reference to FIGS. 1 to 5.

Figure 1:
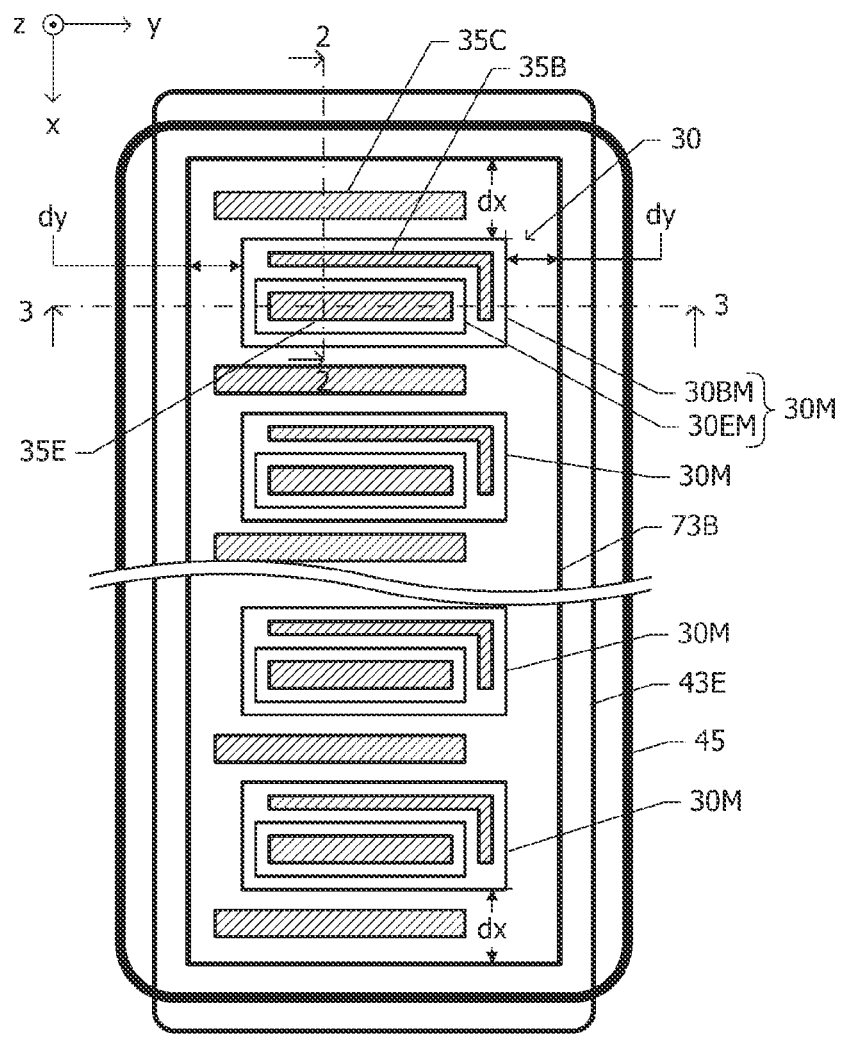
FIG. 1 illustrates positional relationships in plan view between some of elements of a semiconductor device according to a first embodiment.

FIG. 1 illustrates positional relationships in plan view between some of elements of the semiconductor device according to the first embodiment. A plurality of mesa portions 30M, for example, seven of the mesa portions 30M are arranged in a single direction on a substrate. An xyz rectangular coordinate system in which the plane of the substrate is the xy plane, a direction in which the plurality of mesa portions 30M are arranged is the x direction, and a direction normal to the plane of the substrate is the z direction is defined.

The mesa portions 30M each have a two-step configuration that includes a base mesa portion 30BM being a first step and an emitter mesa portion 30EM being a second step. The emitter mesa portion 30EM is contained in the base mesa portion 30BM in plan view. A semiconductor layer included in a transistor 30 is included in the mesa portion 30M. The base mesa portion 30BM and the emitter mesa portion 30EM each have side surfaces extending in the x direction and the y direction. The base mesa portion 30BM and the emitter mesa portion 30EM each have a substantially rectangular shape or a substantially rounded rectangular shape elongated in the y direction in plan view.

An emitter electrode 35E is disposed on an upper surface of the emitter mesa portion 30EM. A base electrode 35B is disposed in a region of an upper surface of the base mesa portion 30BM outside the emitter mesa portion 30EM. The base electrode 35B has, for example, a substantially L shape in plan view and is disposed so as to be separated from the two adjacent sides of the emitter mesa portion 30EM with gaps interposed between the base electrode 35B and the two adjacent sides of the emitter mesa portion 30EM.

Collector electrodes 35C are disposed such that each of the mesa portions 30M is interposed between the collector electrodes 35C in the x direction. A single collector electrode 35C is disposed between two mesa portions 30M adjacent to each other in the x direction and shared between the mesa portions 30M on both sides. In FIG. 1, the emitter electrodes 35E, the base electrodes 35B, and the collector electrodes 35C are hatched.

A multilayer wiring layer is disposed on the plurality of mesa portions 30M. A third emitter wiring 43E of the multilayer wiring layer contains the plurality of mesa portions 30M in plan view. As will be described later with reference to FIGS. 2 and 3, an insulating film under the emitter wiring 43E includes two layers that include an organic layer formed of an organic insulating material and an inorganic layer formed of an inorganic insulating material. A cavity 73B is provided in the organic layer of the emitter wiring 43E. The cavity 73B contains the plurality of mesa portions 30M in plan view. A bump 45 is disposed on the uppermost wiring of the multilayer wiring layer. The bump 45 contains the plurality of mesa portions 30M in plan view.

Figure 2:
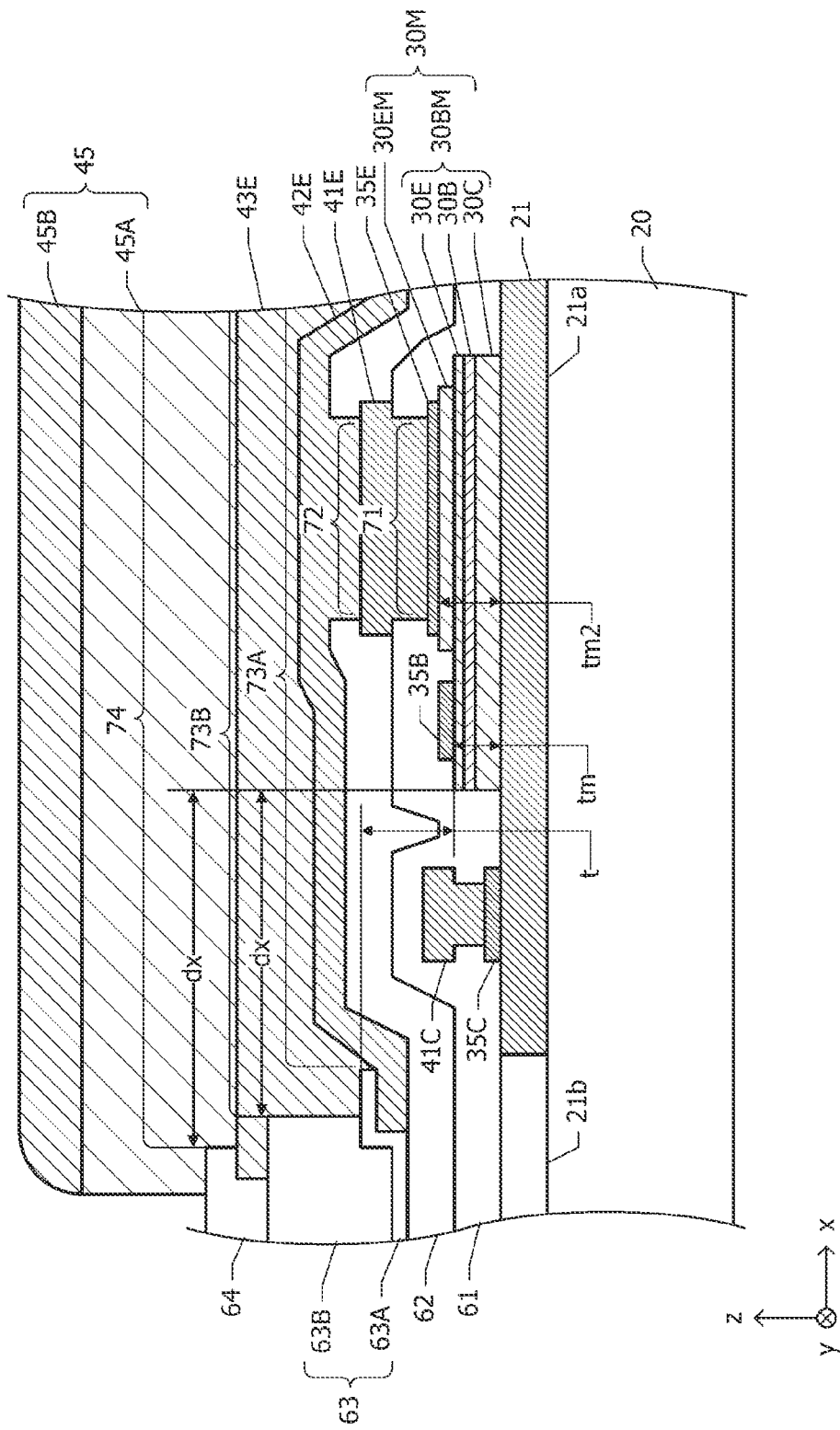
FIG. 2 is a sectional view taken along dotted chain line II-II illustrated in FIG. 1.

FIG. 2 is a sectional view taken along dotted chain line II-II illustrated in FIG. 1. A sub-collector layer 21 formed of GaAs is disposed on a substrate 20 formed of semi-insulating GaAs. The sub-collector layer 21 is divided into an element forming region 21a formed of n-type GaAs or the like and an element isolation region 21b made to be insulative. The thickness of the sub-collector layer 21 is, for example, about 0.5 μm.

The plurality of mesa portions 30M are disposed on the element forming region 21a. In FIG. 2, one of the mesa portions 30M is illustrated. Each of the plurality of mesa portions 30M includes the base mesa portion 30BM being the first step and the emitter mesa portion 30EM being the second step disposed on part of the upper surface of the base mesa portion 30BM.

The base mesa portion 30BM includes a collector layer 30C, a base layer 30B, and an emitter layer 30E sequentially laminated one on top of another from the substrate 20 side.

The collector layer 30C is formed of, for example, n-type GaAs. The thickness of the collector layer 30C is greater than or equal to 0.5 μm and smaller than or equal to 2.5 μm (i.e., from 0.5 μm to 2.5 μm). The base layer 30B is formed of, for example, p-type GaAs. The thickness of the base layer 30B is about 100 nm. The emitter layer 30E is formed of, for example, n-type InGaP. The thickness of the emitter layer 30E is greater than or equal to 30 nm and smaller than or equal to 40 nm (i.e., from 30 nm to 40 nm).

The emitter mesa portion 30EM includes, for example, a layer formed of a heavily doped n-type GaAs and a heavily doped n-type InGaAs disposed on the heavily doped n-type GaAs layer. The thicknesses of both the heavily doped n-type GaAs layer and the heavily doped n-type InGaAs layer are, for example, about 100 nm.

The emitter electrode 35E is disposed on the emitter mesa portion 30EM. The emitter electrode 35E is connected to the emitter layer 30E with the emitter mesa portion 30EM interposed therebetween. The emitter mesa portion 30EM is a layer for providing ohmic contact with the emitter electrode 35E. As is the case with the emitter mesa portion 30EM, the emitter electrode 35E also has a shape elongated in the y direction in plan view. The emitter electrode 35E is formed of, for example, Ti. The thickness of the emitter electrode 35E is about 50 nm.

The base electrode 35B is disposed in a region of the upper surface of the base mesa portion 30BM where the emitter mesa portion 30EM is not disposed. The base electrode 35B is connected to the base layer 30B with an alloying region that penetrates through the emitter layer 30E interposed therebetween. The base electrode 35B includes, for example, three layers that include a Ti film having a thickness of about 50 nm, a Pt film having a thickness of about 50 nm, and an Au film having a thickness of about 200 nm sequentially laminated one on top of another from the lower side.

The collector electrode 35C is disposed in a region of an upper surface of the element forming region 21a where the base mesa portion 30BM is not disposed. The collector electrode 35C is connected to the collector layer 30C with the element forming region 21a interposed therebetween. The collector electrode 35C includes, for example, three layers that include an AuGe film having a thickness of about 60 nm, an Ni film having a thickness of about 10 nm, and an Au film having a thickness of about 200 nm sequentially laminated one on top of another from the lower side.

The transistor 30 includes the collector layer 30C, the base layer 30B, and the emitter layer 30E. According to the first embodiment, the transistor 30 is a heterojunction bipolar transistor. An operating current of the transistor 30 substantially flows in regions of the collector layer 30C, the base layer 30B, and the emitter layer 30E superposed on the emitter mesa portion 30EM in plan view. When the transistor 30 is operated, heat is generated mainly in a region where the operating current flows.

A first insulating film 61 is disposed so as to cover the sub-collector layer 21, the mesa portion 30M, the collector electrode 35C, the base electrode 35B, and the emitter electrode 35E. The insulating film 61 is formed of, for example, an inorganic insulating material such as SiO, SiN, or the like. A first conductor film that includes emitter wiring 41E, collector wiring 41C, and so forth is disposed on the insulating film 61. For example, an Au film having a thickness of greater than or equal to 1 μm and smaller than or equal to 2 μm (i.e., from 1 μm to 2 μm) is used for the first conductor film.

The collector wiring 41C is connected to the collector electrode 35C through a cavity provided in the insulating film 61. The emitter wiring 41E is connected to the emitter electrode 35E through a cavity 71 provided in the insulating film 61.

A second insulating film 62 is disposed so as to cover the insulating film 61, the emitter wiring 41E, the collector wiring 41C. As is the case with the first insulating film 61, the second insulating film 62 is also formed of an inorganic insulating material. The insulating film 62 has a cavity 72. A cavity 72 is contained in the first emitter wiring 41E in plan view. Emitter wiring 42E as a second conductor film is disposed in the cavity 72 and on the insulating film 62. An Au film or a Cu film is used for the second emitter wiring 42E. The second emitter wiring 42E is connected to the first emitter wiring 41E through the cavity 72.

A third insulating film 63 is disposed on the second insulating film 62 and the second emitter wiring 42E. The third insulating film includes an inorganic layer 63A that is formed of an inorganic insulating material such as SiO or SiN and an organic layer 63B that is disposed on the inorganic layer 63A and formed of an organic insulating material such as polyimide or benzocyclobutene (BCB). The inorganic layer 63A and the organic layer 63B have a cavity 73A and a cavity 73B, respectively. The cavity 73A is contained in the emitter wiring 42E in plan view. Furthermore, the cavity 73A is smaller than the cavity 73B and contained in the cavity 73B.

The emitter wiring 43E as a third conductor film is disposed in the cavities 73A, 73B and on the insulating film 63. For example, a Cu film is used for the emitter wiring 43E. The emitter wiring 43E is connected to the second emitter wiring 42E through the cavities 73B, 73A.

A protection film 64 is disposed on the third emitter wiring 43E and the third insulating film 63. An organic insulating material such as polyimide or benzocyclobutene is used for the protection film 64. The protection film 64 has a cavity 74. The cavity 74 is contained in the third emitter wiring 43E in plan view.

The bump 45 is disposed in the cavity 74 and on the protection film 64. The bump 45 includes a metal post 45A and a solder layer 45B disposed on the metal post 45A. For example, Cu is used for the metal post 45A. The height of the metal post 45A is, for example, greater than or equal to 30 μm and smaller than or equal to 50 μm (i.e., from 30 μm to 50 μm). Solder that includes Sn such as Sn or an SnAg alloy is used for the solder layer 45B. The thickness of the solder layer 45B is, for example, greater than or equal to 10 μm and smaller than or equal to 30 μm (i.e., from 10 μm to 30 μm). An under bump metal layer formed of high melting metal such as Ti or TiW may be disposed under the metal post 45A.

After an element structure from the sub-collector layer 21 to the bump 45 has been formed on the substrate 20, the element structure is singulated by cutting with a dicing machine, thereby the semiconductor device is completed.

When the bump 45 and a land of a module board (mounting board) are connected to each other, the semiconductor device is mounted face-down on the module board. Other circuit components such as, for example, an inductor and a capacitor are also mounted on the module board. After the semiconductor device and so forth have been mounted on the module board, resin sealing is performed, thereby a power amplifier module is completed.

When the transistor 30 is operated, the operating current flows from the element forming region 21a of the sub-collector layer 21 toward the emitter electrode 35E. Thus, when the transistor 30 is operated as a power transistor for signal amplification, the regions of the emitter layer 30E, the base layer 30B, and the collector layer 30C superposed on the emitter mesa portion 30EM in plan view are a heat generation source. The heat generated by the heat generation source is conducted to the module board through a heat conduction path that includes the emitter electrode 35E, the first emitter wiring 41E, the second emitter wiring 42E, the third emitter wiring 43E, and the bump 45.

The height of the first step of the mesa portion 30M, that is, the height from an upper surface of the sub-collector layer 21 to the upper surface of the base mesa portion 30BM is represented by tm. The total height of the first step and the second step of the mesa portion 30M, that is, the height from the upper surface of the sub-collector layer 21 to the upper surface of the emitter mesa portion 30EM is represented by tm2. Here, the heights of the first step and the second step of the mesa portion 30M represent the heights of portions formed by the semiconductor. The emitter electrode 35E or the base electrode 35B formed of metal is not included in the height of the mesa portion 30M.

A smaller distance out of the distances in the x direction from the mesa portion 30M (FIG. 1) to side surfaces on both sides of the cavity 73B (FIGS. 1 and 2) of the organic layer 63B (FIG. 2) in plan view is represented by dx. For example, when focusing on one of the mesa portions 30M positioned uppermost in FIG. 1, the distance in the x direction from the mesa portion 30M to the upper side surface of the cavity 73B is smaller than the distance in the x direction from the mesa portion 30M to the lower side surface of the cavity 73B. Thus, for the uppermost mesa portion 30M, the distance in the x direction from the mesa portion 30M to the upper side surface of the cavity 73B is represented by dx. For the lowermost mesa portion 30M in FIG. 1, the distance in the x direction from the mesa portion 30M to the lower side surface of the cavity 73B is represented by dx.

In the example illustrated in FIG. 2, the side surface of the mesa portion 30M and the side surface of the cavity 73B are perpendicular to the x direction. However, when these side surfaces are inclined relative to the plane (xy plane) of the substrate 20, the distance between two side surfaces in the x direction cannot be uniquely identified. In this case, a position where the distance in the x direction between the side surfaces is smallest is adopted as a reference point for determination of the distance dx. For example, in plan view, when a lower end of the side surface of the cavity 73B is closer to the mesa portion 30M than an upper end of the side surface of the cavity 73B, the distance in the x direction from the mesa portion 30M to the lower end of the side surface of the cavity 73B is adopted as the distance dx.

Likewise, a smaller distance out of the distances in the x direction from the mesa portion 30M to side surfaces on both sides of the cavity 74 of the protection film 64 (FIG. 2) is represented by dx. In the section illustrated in FIG. 2, only one of the side surfaces on both the sides of the cavity 74 of the protection film 64 is illustrated.

The height from an upper surface of the first step of the mesa portion 30M to the lower end of the side surface of the cavity 73B (in the z direction) is represented by t.

Both the distance dx related to the cavity 73A of the organic layer 63B and the distance dx related to the cavity 74 of the protection film 64 are greater than or equal to a height tm of the first step of the mesa portion 30M. Furthermore, both the distance dx related to the cavity 73A of the organic layer 63B and the distance dx related to the cavity 74 of the protection film 64 are greater than or equal to the height t.

Figure 3:
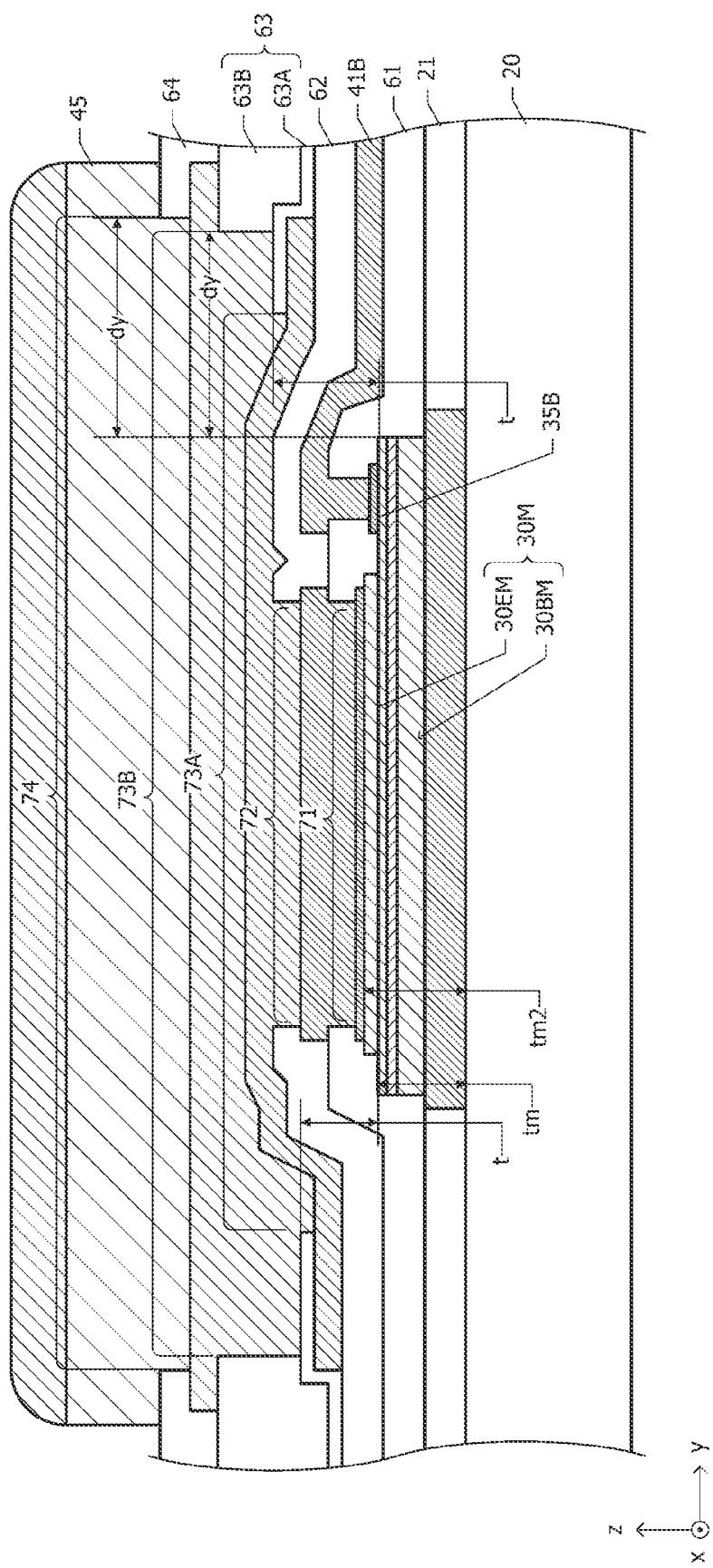
FIG. 3 is a sectional view taken along dotted chain line illustrated in FIG. 1.

FIG. 3 is a sectional view taken along dotted chain line illustrated in FIG. 1. In the following, description of configurations common with the sectional configurations illustrated in FIG. 2 is omitted.

The first conductor film disposed on the first insulating film 61 includes base wiring 41B in addition to the emitter wiring 41E and the collector wiring 41C (FIG. 2). The base wiring 41B is connected to the base electrode 35B through a cavity provided in the insulating film 61. The base wiring 41B extends in the y direction from a position connected to the base electrode 35B and is led out to the outside of the mesa portion 30M in plan view.

A smaller distance out of the distances in the y direction from the mesa portion 30M to side surfaces on both sides of the cavity 73B of the organic layer 63B is represented by dy.

Likewise, a smaller distance out of the distances in the y direction from the mesa portion 30M to side surfaces on both sides of the cavity 74 provided in the protection film 64 is represented by dy. In FIG. 3, the distance in the y direction from the mesa portion 30M to the right side surface of the cavity 73B corresponds to dy. Also, the distance in the y direction from the mesa portion 30M to the right side surface of the cavity 74 corresponds to dy. With each of the cavities 73B, 74, the distance dy is greater than the height tm of the first step of the mesa portion 30M.

Furthermore, the right side surface of the cavity 73B in the section illustrated in FIG. 3 intersects the first base wiring 41B in plan view. In this intersecting position, the lower end of the side surfaces of the cavity 73B is disposed at a higher position than the position of the lower end at the other positions with reference, in height, to the upper surface of the first step of the mesa portion 30M. Thus, the height t at this intersecting position is greater than the height t at the other position. The distance dy in the y direction at the position intersecting the base wiring 41B (right side in FIG. 3) is greater than or equal to the height t at the intersecting position (right side in FIG. 3). The distance dy in the y direction at the position not intersecting the base wiring 41B (left side in FIG. 3) is greater than or equal to the height t at the non-intersecting position (left side in FIG. 3).

Next, good effects according of the first embodiment are described.

Figure 4:
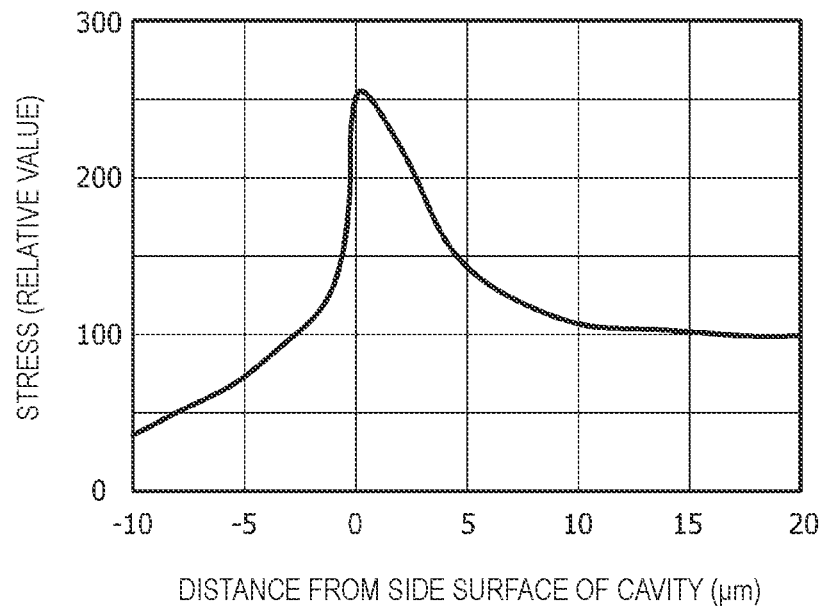
FIG. 4 is a graph illustrating a result, obtained by simulation, of a distribution of stress generated when the temperature is returned to room temperature after the semiconductor device according to the first embodiment has been mounted on a package board.

First, referring to FIG. 4, a position where the stress is likely to be generated by heat treatment when the semiconductor device according to the first embodiment is mounted on a package board is described.

FIG. 4 is a graph illustrating a result, obtained by simulation, of a distribution of the stress generated when the temperature is returned to room temperature after the semiconductor device according to the first embodiment has been mounted on the package board. The horizontal axis represents the distance in μm in the x direction from the position of the side surfaces of the cavity 73B in the section illustrated in FIG. 2. The position at which the distance from the side surfaces of the cavity 73B is 20 μm corresponds to the center of the cavity 73B. The vertical axis of FIG. 4 represents the relative value of the stress applied to an upper surface of the second emitter wiring 42E when the stress at the center of the cavity 73B is set as 100. In a range where the x is negative, the stress applied to the lower surface of the organic layer 63B of the insulating film 63 is represented.

In the simulation, mounting on the package board is performed by heating the solder layer 45B to about 260° C. to melt the solder layer 45B. A state assumed when the solder layer 45B is melted is a stress-free state. The solder layer 45B is solidified at about 220° C., and then, the stress is generated by the time when the temperature returns to room temperature.

The thickness of the elements of the semiconductor device subjected to the simulation is as follows. The thickness of the emitter electrode 35E is sufficiently small compared to the other layers and omitted.

Base mesa portion 30BM: 1.5 μm
Emitter mesa portion 30EM: 0.2 μm
First emitter wiring 41E: 1 μm
Second emitter wiring 42E: 4 μm
Third emitter wiring 43E: 10 μm
Bump 45: 70 μm
First insulating film 61: 0.5 μm
Second insulating film 62: 1 μm
Inorganic layer 63A of third insulating film 63: 0.5 μm
Organic layer 63B of third insulating film 63: 10 μm
Protection film 64: 10 μm.

The coefficient of linear expansion and the Young's modulus of the materials used for the elements of the semiconductor device are described as follows.

GaAs: coefficient of linear expansion; 6 ppm/° C., Young's modulus; 83 GPa
Polyimide: coefficient of linear expansion; 50 ppm/° C., Young's modulus; 3 GPa
SiN: coefficient of linear expansion; 3 ppm/° C., Young's modulus; 200 GPa
Au: coefficient of linear expansion; 14.2 ppm/° C., Young's modulus; 80 GPa
Cu: coefficient of linear expansion; 16.5 ppm/° C., Young's modulus; 123 GPa
Solder: coefficient of linear expansion; 23 ppm/° C., Young's modulus; 40 GPa
Package board: coefficient of linear expansion: 10 ppm/° C., Young's modulus; 30 GPa.

SiN and polyimide are used for the inorganic layer 63A and the organic layer 63B, respectively. Au is used for the emitter wiring 41E, 42E, 43E, and Cu is used for the metal post 45A. GaAs is used for semiconductor portions of the mesa portion 30M, the substrate 20, and so forth.

It can be understood that the stress is highest at the position of the side surface of the cavity 73B. Since the Young's modulus of the organic layer 63B is significantly smaller than that of the metal wiring, the inorganic layer, and the semiconductor portions, large strain is generated near the position in contact with the side surface of the cavity 73B provided in the organic layer 63B. As a result, the stress is increased near the side surface of the cavity 73B.

When the stress is applied to the mesa portion 30M, cracks are generated in the mesa portion 30M. These cracks cause malfunctions of the transistor 30. As the height tm of the level difference of the first step of the mesa portion 30M increases, the likelihood of generation of the cracks increases. Thus, as the height tm of the level difference increases, it is preferable to increase reduction of the stress applied to the mesa portion 30M. When the distance of the position where large stress is generated (side surface of the cavity 73B) from the mesa portion 30M increases in the transverse direction, the stress applied to the mesa portion 30M reduces.

According to the first embodiment, the distance dx (FIGS. 1 and 2) is greater than or equal to the height tm. Thus, the stress applied to the mesa portion 30M is reduced, and generation of the cracks caused by the stress can be suppressed. This can suppress degradation of the reliability of the transistor 30.

In order to improve the effect of suppressing the generation of the cracks, it is more preferable that the distance dx be greater than or equal to the height tm2. It is still more preferable that the distance dx be greater than or equal to the height t.

The cavities 71, 72, 73A are provided in the layers formed of an inorganic insulating material such as SiN. The Young's modulus of the inorganic insulating material is sufficiently higher than that of the organic insulating material and higher than that of Au or Cu. Accordingly, a phenomenon in which the stress increases as illustrated in FIG. 4 is not caused near the side surfaces of the cavities 71, 72, 73A. Thus, the positional relationships between the side surfaces of the cavities 71, 72, 73A and the mesa portion 30M in plan view do not particularly cause a problem in terms of the stress.

Similarly, in the y direction, when the distance dy (FIGS. 1 and 3) is greater than or equal to the height tm, the generation of the cracks in the mesa portion 30M can be suppressed. In order to improve the effect of suppressing the generation of the cracks, it is more preferable that the distance dy be greater than or equal to the height tm2. It is still more preferable that the distance dy be greater than or equal to the height t.

Figure 5:
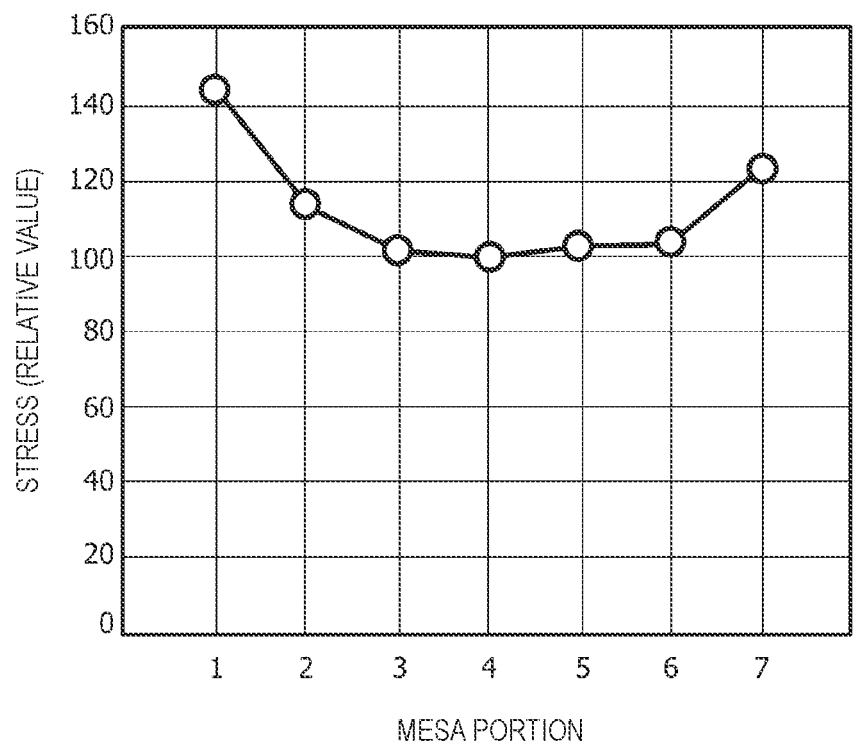
FIG. 5 is a graph illustrating a result of simulation of stress applied to seven mesa portions arranged in the x direction.

Next, referring to FIG. 5, the difference in stress between the plurality of mesa portions 30M arranged in the x direction is described.

FIG. 5 is a graph illustrating a result of simulation of stress applied to seven mesa portions 30M arranged in the x direction (FIG. 1). Simulation conditions are the same as the conditions of the simulation the result of which is illustrated in FIG. 4. The horizontal axis represents serial numbers assigned to the mesa portions 30M in the order of arrangement. The vertical axis represents the relative value of the stress applied to the mesa portions 30M when the stress applied to the fourth mesa portion 30M, that is, the central mesa portion 30M, is set as 100. As the stress applied to each of the mesa portions 30M, a value obtained by averaging, in the plane, values of the stress applied to the upper surface of the base mesa portion 30BM is adopted.

It can be understood that the stress increases from the central mesa portion 30M toward the mesa portions 30M at both ends. The reason why the graph illustrated in FIG. 5 is asymmetrical in the left-right direction is that influence of, for example, the positions of the mesa portions 30M in the surface of the substrate 20 is reflected. The reason why the mesa portions 30M at both ends are subjected to relatively large stress is that the mesa portions 30M at both ends are largely subjected to influence from the side surfaces positioned at both ends of the cavity 73B (FIG. 1) in the x direction.

In order to reduce the influence from the side surfaces positioned at both ends of the cavity 73B (FIG. 1) in the x direction, it is preferable to increase the distance dx (FIG. 1) related to the mesa portions 30M at both ends to a greater value than that of the distance dy. With this configuration, the stress applied to the plurality of mesa portions 30M can be leveled among the mesa portions 30M.

Furthermore, according to the first embodiment, the plurality of mesa portions 30M are contained in the bump 45 in plan view. Also, the cavities 73B, 74 contain the plurality of mesa portions 30M in plan view. Thus, no organic insulating material exists in the heat conduction path from the mesa portions 30M toward the bump 45. This reduces thermal resistance of the heat conduction path from the mesa portions 30M to the bump 45, thereby enabling efficient conduction of the heat generated in the transistor 30 to the bump 45. As has been described, in the semiconductor device according to the first embodiment, both heat dissipation from the mesa portions 30M and reduction of the stress applied to the mesa portions 30M can be realized. Thus, the reliability of the semiconductor device can be improved.

The inorganic layer 63A of the third insulating film 63 (FIGS. 2 and 3) has the function of suppressing entrance of water from outside. When the cavity 73A is smaller than the cavity 73B in plan view, moisture resistance can be improved. In the case where sufficient moisture resistance can be reliably provided even without the inorganic layer 63A, the inorganic layer 63A is not necessarily disposed.

Next, variations of the first embodiment are described.

According to the first embodiment, two layers, that is, the organic layer 63B and the protection film 64 are disposed as the layers formed of an organic insulating material. With this configuration, according to the first embodiment, in both the cavity 73B of the organic layer 63B and the cavity 74 of the protection film 64, the distance dx (FIG. 2) is set to be greater than or equal to the height tm. The distance dx (FIG. 2) may be greater than or equal to the height tm in one of the cavity 73B of the organic layer 63B and the cavity 74 of the protection film 64. Also in this case, the effect of reduction of the stress from the side surface of one of the cavities where the distance dx is set to be greater than or equal to the height tm can be obtained.

The influence of the stress affecting the mesa portion 30M is greater from the layer disposed relatively lower side. Thus, the influence of the distance dx in the cavity 73B of the organic layer 63B on the lower side is greater than the influence of the distance dx in the cavity 74 of the protection film 64 on the upper side. Accordingly, the effect that can be obtained is greater by setting the distance dx in the cavity 73B of the organic layer 63B to be greater than or equal to the height tm than by setting the distance dx in the cavity 74 of the protection film 64 to be greater than or equal to the height tm.

Although the collector layer 30C is not disposed in a region other than the mesa portion 30M according to the first embodiment, part of the collector layer 30C on the substrate side may be left in a region other than the mesa portion 30M. As is the case with the element isolation region 21b of the sub-collector layer 21 (FIG. 2), an insulated element isolation region is formed in the left collector layer 30C. In this configuration, part of the semiconductor layer included in the transistor 30 is included in the mesa portion 30M. At least part of the semiconductor layer included in the transistor 30 may be included in the mesa portion 30M as described above.

When the configuration in which part of the collector layer 30C on the substrate side is left is adopted, the mesa portion 30M includes a portion higher than an upper surface of the left collector layer 30C. As the height tm, tm2 (FIGS. 2 and 3), the height from the upper surface of the left collector layer 30C can be adopted.

Although GaAs and InGap are used for the transistor 30 according to the first embodiment, another semiconductor may be used. Use of a compound semiconductor for the transistor 30 increases the likelihood of cracks being generated in the mesa portion 30M compared to the case where a single-element semiconductor is used. Thus, with the configuration according to the first embodiment, particularly significant effects can be obtained when a compound semiconductor is used for the mesa portion 30M.

Second Embodiment

Next, a semiconductor device according to a second embodiment is described with reference to FIGS. 6 and 7. In the following, description of configurations common with the semiconductor device according to the first embodiment (FIGS. 1, 2, and 3) is omitted.

Figure 6:
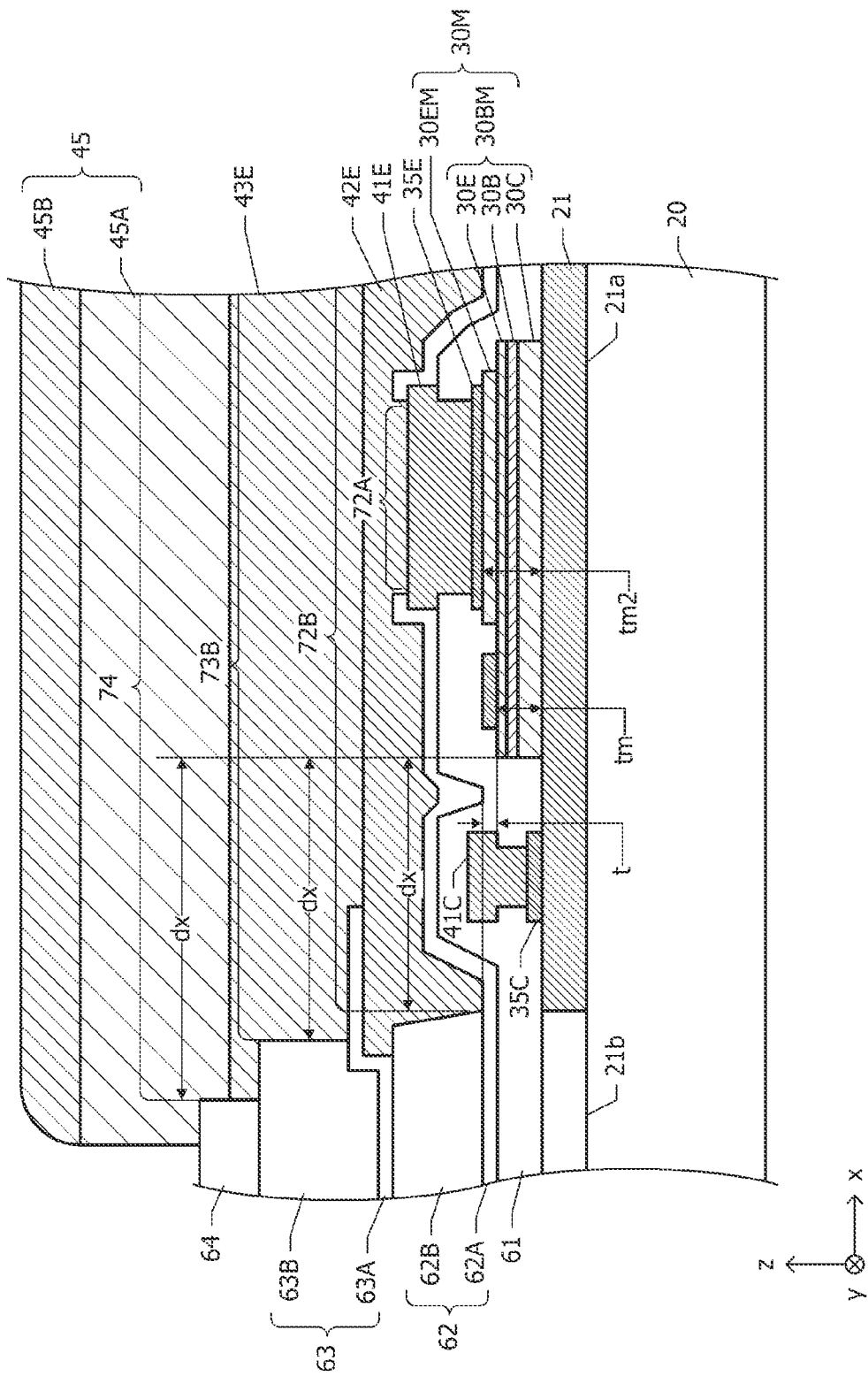
FIG. 6 is a sectional view of a semiconductor device according to a second embodiment.
Figure 7:
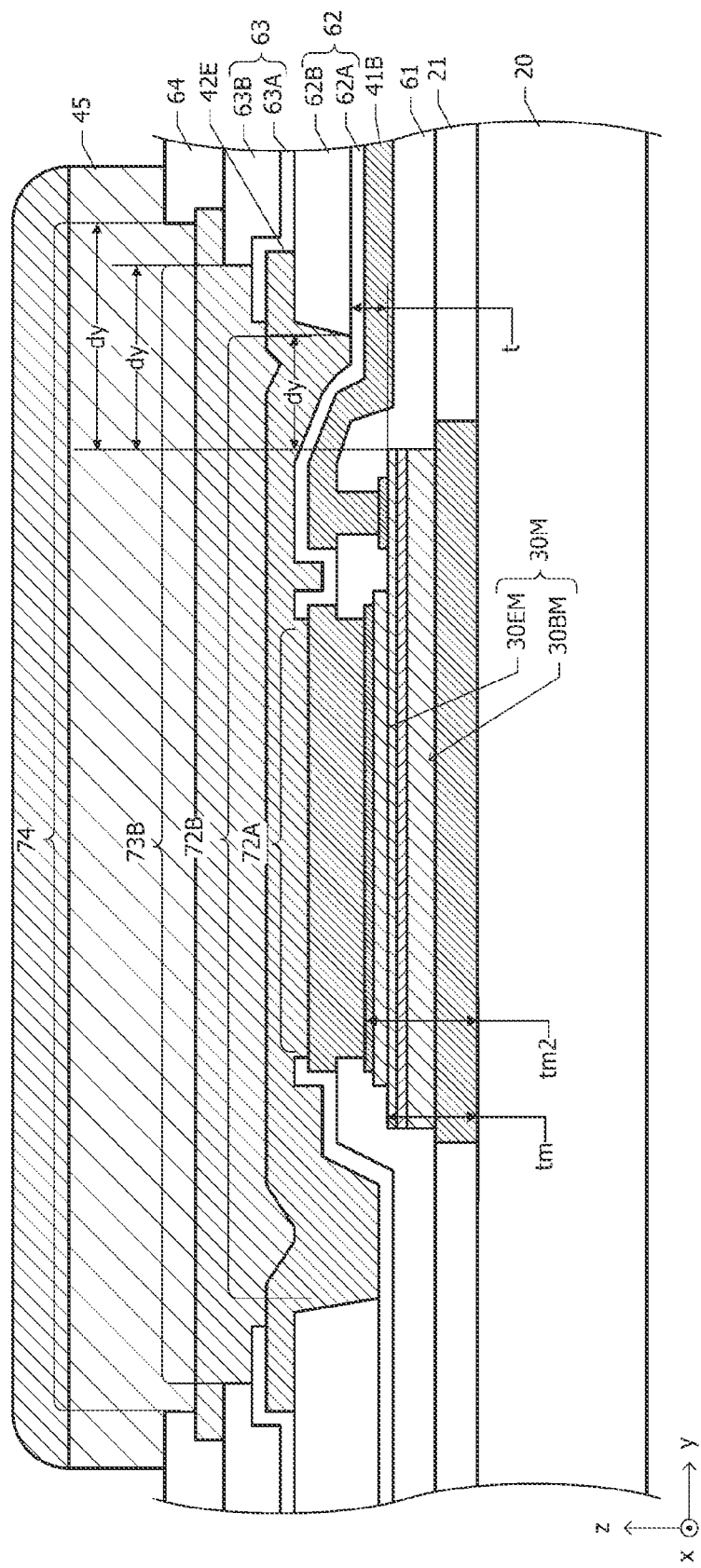
FIG. 7 is another sectional view of the semiconductor device according to the second embodiment.

FIGS. 6 and 7 are sectional views of the semiconductor device according to the second embodiment and respectively correspond to the sections taken along dotted chain line II-II and dotted chain line III-III illustrated in FIG. 1. According to the first embodiment, the second insulating film 62 (FIGS. 2 and 3) is formed of an inorganic insulating material. In contrast, according to the second embodiment, the second insulating film 62 includes two layers, that is, an inorganic layer 62A formed of an inorganic insulating material and an organic layer 62B disposed on the inorganic layer 62A and formed of an organic insulating material.

As is the case with the cavity 72 provided in the insulating film 62 of the semiconductor device according to the first embodiment, a cavity 72A provided in the inorganic layer 62A is contained in the first emitter wiring 41E in plan view. A cavity 72B provided in the organic layer 62B contains the mesa portion 30M in plan view. A smaller distance out of the distances in the x direction from the mesa portion 30M to side surfaces on both sides of the cavity 72B is represented by dx (FIG. 6). A smaller distance out of the distances in the y direction from the mesa portion 30M to side surfaces on both sides of the cavity 72B is represented by dy (FIG. 7). In FIG. 7, the distance in the y direction from the mesa portion 30M to the right side surface of the cavity 72B is adopted as dy.

The distance dx and the distance dy in the cavity 72B are greater than or equal to the height tm. Furthermore, the distance dx and the distance dy in the cavity 72B are greater than or equal to the height t.

Next, good effects according of the second embodiment are described.

Also according to the second embodiment, both the distance dx and the distance dy in the cavity 72A are set to be greater than or equal to the height tm. Thus, as is the case with the first embodiment, the stress applied to the mesa portion 30M can be reduced. Furthermore, according to the second embodiment, the organic layer 62B of the second insulating film 62 is disposed between part of the first base wiring 41B and part of the second emitter wiring 42E. Since the distance between the base wiring 41B and the emitter wiring 42E increases in the thickness direction at the position where the organic layer 62B is disposed, the parasitic capacitance between the base wiring 41B and the emitter wiring 42E can be reduced.

The distance dy in the cavity 72B may be smaller than or equal to the height tm at the position intersecting the base wiring 41B to give precedence to the parasitic capacitance reduction effect over the stress reduction effect. The reduction in the distance dy reduces the area of part where the first base wiring 41B and the second emitter wiring 42E are superposed on each other in the up-down direction with only the inorganic layer 62A interposed therebetween. As a result, the parasitic capacitance between the base wiring 41B and the emitter wiring 42E can be further reduced.

Next, a first variation of the second embodiment is described.

Although an organic insulating material is used for three insulating films out of the insulating films of the multilayer wiring layer on the substrate 20 according to the second embodiment, four or more layers formed of an organic insulating material may be disposed by increasing the number of layers of the multilayer wiring layer. In this case, it is sufficient that the distance dx and the distance dy in the cavity 72B in the cavity provided in at least one layer out of the plurality of layers formed of an organic insulating material be greater than or equal to the height tm. It is more preferable that the distance dx and the distance dy in the cavities of all the layers formed of an organic insulating material be greater than or equal to the height tm.

The third emitter wiring 43E may be wiring in a redistribution layer. When a redistribution layer is provided, versatility of disposition of a plurality of bumps can be improved. Even when the emitter wiring 43E is wiring in the redistribution layer, it is preferable that the bump 45 connected to the emitter electrode 35E be disposed so as to contain the plurality of mesa portions 30M in plan view for improvement of the heat dissipation.

Next, a second variation of the second embodiment is described. According to the second embodiment, the organic layer 62B of the second insulating film 62 is disposed above the part of the first base wiring 41B (FIG. 7). The organic layer 62B is not disposed on the collector electrode 35C (FIG. 6). In contrast, according to the second variation, the organic layer 62B having the substantially same shape as that of the collector electrode 35C in the plan view illustrated in FIG. 1 is provided. According to the second variation, a cavity region provided in the organic layer 62B is large. Thus, the organic layer 62B includes a plurality of isolated patterns.

According to the second variation, as the distance dx, the distance in the x direction from the mesa portion 30M (FIG. 1) to the organic layer 63B, that is, the collector electrodes 35C in plan view can be adopted. As is the case with the second embodiment, it is preferable that the distance dx be greater than or equal to the height tm or the height t. As an advantage of the second variation, parasitic capacitance generated between the first collector wiring 41C and the second emitter wiring 42E (FIG. 6) can be reduced because of the existence of the organic layer 62B being a thick film on the part of the first collector wiring 41C. As a result, high-frequency characteristics of the semiconductor element can be improved.

Third Embodiment

Next, a semiconductor device according to a third embodiment is described with reference to FIG. 8. In the following, description of configurations common with the semiconductor device according to the second embodiment (FIGS. 6 and 7) is omitted.

Figure 8:
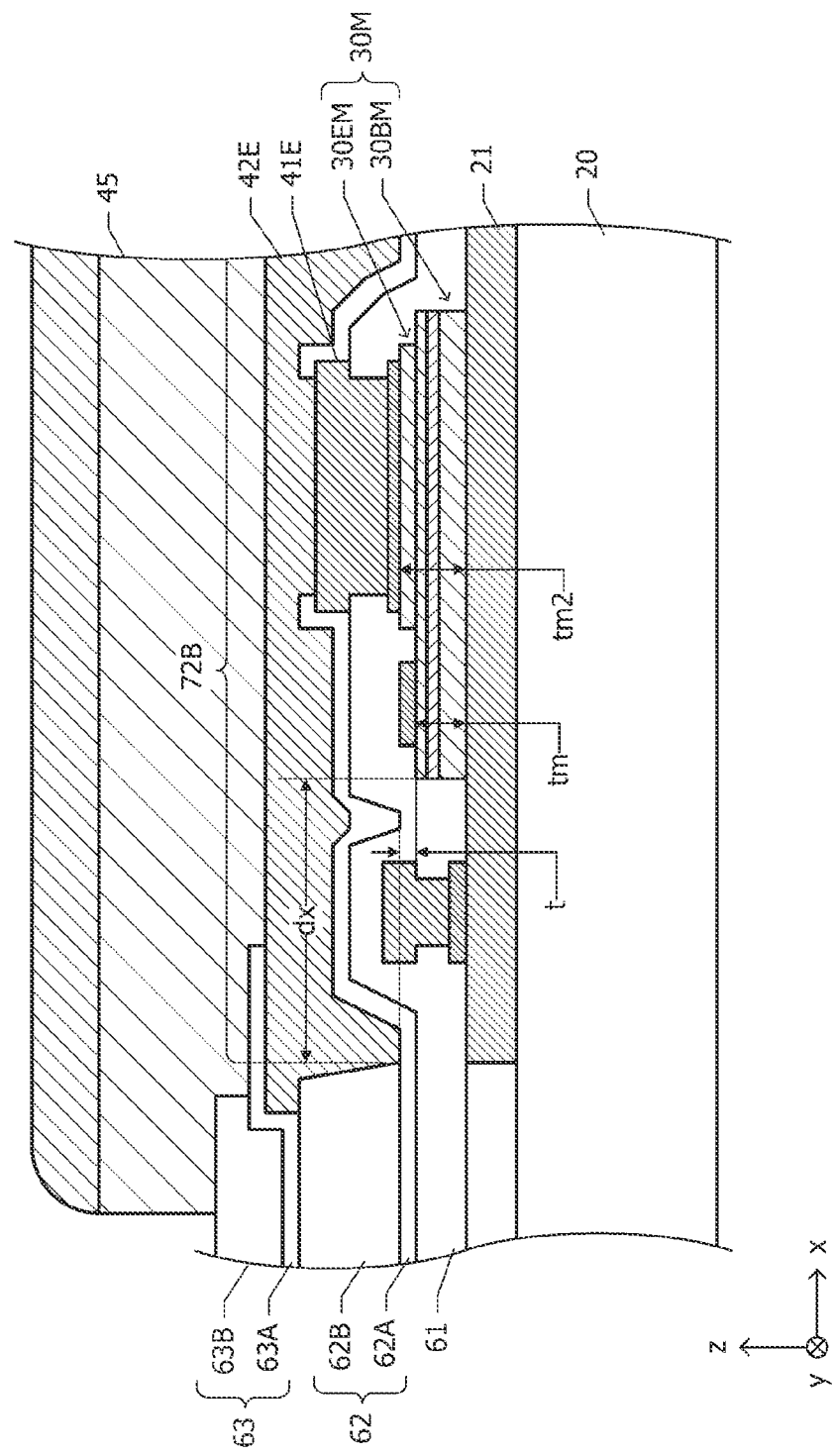
FIG. 8 is a sectional view of the semiconductor device according to a third embodiment.

FIG. 8 is a sectional view of the semiconductor device according to the third embodiment. According to the third embodiment, the third emitter wiring 43E and the protection film 64 on the emitter wiring 43E according to the second embodiment (FIGS. 6 and 7) are omitted, and the bump 45 is disposed on the insulating film 63 and in the cavity 73 provided in the third insulating film 63.

Next, good effects according of the third embodiment are described. As is the case with the second embodiment, according to the third embodiment, when the distance dx is greater than or equal to the height tm, the stress can be reduced, and the generation of the cracks due to the stress can be suppressed. Thus, the reliability of the semiconductor device can be improved.

Fourth Embodiment

Next, a semiconductor device according to a fourth embodiment is described with reference to FIG. 9. In the following, description of configurations common with the semiconductor device according to the first embodiment (FIGS. 1, 2, and 3) is omitted.

Figure 9:
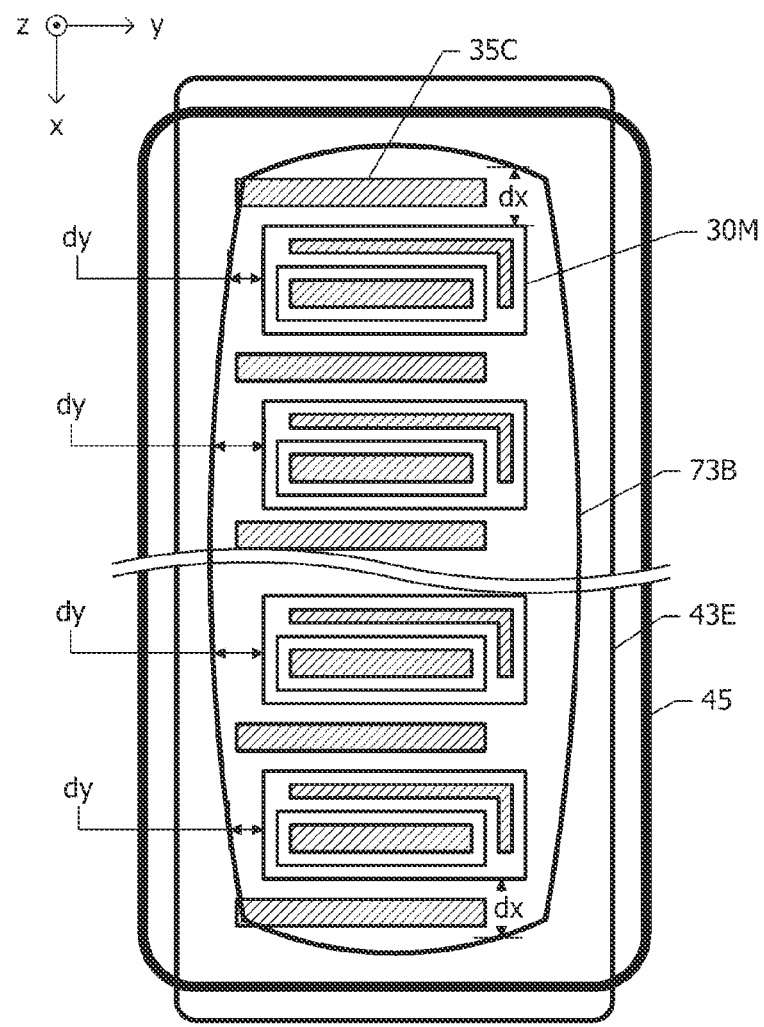
FIG. 9 illustrates positional relationships in plan view between some of elements of the semiconductor device according to a fourth embodiment.

FIG. 9 illustrates positional relationships in plan view between some of elements of the semiconductor device according to the fourth embodiment. According to the first embodiment, the distance dx is fixed independently of the position in the y direction. In contrast, according to the fourth embodiment, the distance dx varies along the y direction. In this case, the cavity 73B and the mesa portions 30M can be disposed so that an average value obtained by averaging values of the distance dx along the y direction is greater than or equal to the height tm (FIG. 2).

Furthermore, according to the first embodiment, in each of the plurality of mesa portions 30M, the distance dy is fixed independently of the position in the x direction, and the distance dy is the same among the plurality of mesa portions 30M. In contrast, according to the fourth embodiment, the distance dy varies along the x direction in each of the plurality of mesa portions 30M. In this case, the cavity 73B and the mesa portions 30M can be disposed so that an average value obtained by averaging values of the distance dy along the x direction is greater than or equal to the height tm (FIG. 3) for each of the mesa portions 30M. Furthermore, the cavity 73B and the mesa portions 30M can be disposed so that the distance dy is greater than or equal to the height tm in each of the mesa portions 30M.

The above-described embodiments are only exemplary. Of course, the configurations described for different embodiments can be partially substituted or combined. Similar effects by similar configurations of the plurality of embodiments are not individually referred to for each of the embodiments. Furthermore, the present disclosure is not limited to the above-described embodiments. For example, it is obvious for one skilled in the art that various changes, modifications, combinations and so forth are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
   a substrate;
   at least one mesa portion that is on the substrate that includes at least part of a transistor therein, and that has a plurality of different surfaces at different heights from the substrate;
   an insulating film that is disposed at a height from the substrate greater than a height of the at least one mesa portion, the insulating film including a first cavity and an organic layer including an organic insulating material; and
   a conductor film that is disposed on the insulating film and that is electrically connected to the transistor through the first cavity provided in the insulating film, wherein
   the first cavity is in the organic layer, the first cavity containing the at least one mesa portion in plan view and having side surfaces extending in a first direction and a second direction, wherein the second direction is perpendicular to the first direction, and
   when a shorter distance out of distances in the second direction from the at least one mesa portion to the side surfaces on both sides of the first cavity of the organic layer in the plan view is defined as a first distance, a shorter distance out of distances in the first direction from the at least one mesa portion to the side surfaces on both sides of the first cavity of the organic layer in the plan view is defined as a second distance, and a height of a first step of the at least one mesa portion is defined as a first height,
   at least one of the first distance and the second distance is greater than or equal to the first height.

2. The semiconductor device according to claim 1, wherein
   when a distance in a height direction from an upper surface of the first step of the at least one mesa portion to lower ends of the side surfaces of the first cavity of the organic layer is defined as a second height, at least one of the first distance and the second distance is greater than or equal to the second height.

3. The semiconductor device according to claim 1, wherein
   the at least one mesa portion includes a plurality of mesa portions arranged in the second direction,
   the first cavity of the organic layer contains the plurality of mesa portions in the plan view, and
   the first distance is greater than the second distance in mesa portions respectively positioned at both ends in the second direction out of the plurality of mesa portions.

4. The semiconductor device according to claim 1, wherein
   the insulating film includes an inorganic layer that is disposed under the organic layer and that includes an inorganic insulating material, and a second cavity of the inorganic layer is smaller than the first cavity of the organic layer in the plan view.

5. The semiconductor device according to claim 1, wherein
   the at least one mesa portion includes a compound semiconductor.

6. The semiconductor device according to claim 1, wherein
   the first distance is a smaller average of an average of values of the distances in the second direction from the at least one mesa portion to the side surfaces of the first cavity of the organic layer on one of both the sides in the plan view averaged along the first direction and an average of values of the distances in the second direction from the at least one mesa portion to the side surfaces of the first cavity of the organic layer on another of both the sides in the plan view averaged along the first direction.

7. The semiconductor device according to claim 1, further comprising:
   a protection film that is disposed on the insulating film and the conductor film and that has a third cavity contained in the conductor film in the plan view; and
   a bump that is disposed on the protection film and in the third cavity provided in the protection film and that is connected to the conductor film.

8. The semiconductor device according to claim 2, wherein
   the at least one mesa portion includes a plurality of mesa portions arranged in the second direction,
   the first cavity of the organic layer contains the plurality of mesa portions in the plan view, and
   the first distance is greater than the second distance in mesa portions respectively positioned at both ends in the second direction out of the plurality of mesa portions.

9. The semiconductor device according to claim 2, wherein
the insulating film includes an inorganic layer that is disposed under the organic layer and that includes an inorganic insulating material, and a second cavity of the inorganic layer is smaller than the first cavity of the organic layer in the plan view.

10. The semiconductor device according to claim 3, wherein
the insulating film includes an inorganic layer that is disposed under the organic layer and that includes an inorganic insulating material, and a second cavity of the inorganic layer is smaller than the first cavity of the organic layer in the plan view.

11. The semiconductor device according to claim 2, wherein
the at least one mesa portion includes a compound semiconductor.

12. The semiconductor device according to claim 3, wherein
the at least one mesa portion includes a compound semiconductor.

13. The semiconductor device according to claim 4, wherein
the at least one mesa portion includes a compound semiconductor.

14. The semiconductor device according to claim 2, wherein
the first distance is a smaller average of an average of values of the distances in the second direction from the at least one mesa portion to the side surfaces of the first cavity of the organic layer on one of both the sides in the plan view averaged along the first direction and an average of values of the distances in the second direction from the at least one mesa portion to the side surfaces of the first cavity of the organic layer on another of both the sides in the plan view averaged along the first direction.

15. The semiconductor device according to claim 3, wherein
the first distance is a smaller average of an average of values of the distances in the second direction from the at least one mesa portion to the side surfaces of the first cavity of the organic layer on one of both the sides in the plan view averaged along the first direction and an average of values of the distances in the second direction from the at least one mesa portion to the side surfaces of the first cavity of the organic layer on another of both the sides in the plan view averaged along the first direction.

16. The semiconductor device according to claim 4, wherein
the first distance is a smaller average of an average of values of the distances in the second direction from the at least one mesa portion to the side surfaces of the first cavity of the organic layer on one of both the sides in the plan view averaged along the first direction and an average of values of the distances in the second direction from the at least one mesa portion to the side surfaces of the first cavity of the organic layer on another of both the sides in the plan view averaged along the first direction.

17. The semiconductor device according to claim 5, wherein
the first distance is a smaller average of an average of values of the distances in the second direction from the at least one mesa portion to the side surfaces of the first cavity of the organic layer on one of both the sides in the plan view averaged along the first direction and an average of values of the distances in the second direction from the at least one mesa portion to the side surfaces of the first cavity of the organic layer on another of both the sides in the plan view averaged along the first direction.

18. The semiconductor device according to claim 2, further comprising:
a protection film that is disposed on the insulating film and the conductor film and that has a third cavity contained in the conductor film in the plan view; and
a bump that is disposed on the protection film and in the third cavity provided in the protection film and that is connected to the conductor film.

19. The semiconductor device according to claim 3, further comprising:
a protection film that is disposed on the insulating film and the conductor film and that has a third cavity contained in the conductor film in the plan view; and
a bump that is disposed on the protection film and in the third cavity provided in the protection film and that is connected to the conductor film.

20. The semiconductor device according to claim 4, further comprising:
a protection film that is disposed on the insulating film and the conductor film and that has a third cavity contained in the conductor film in the plan view; and
a bump that is disposed on the protection film and in the third cavity provided in the protection film and that is connected to the conductor film.

* * * * *